US009083296B2

(12) United States Patent
Rajaee

(10) Patent No.: US 9,083,296 B2
(45) Date of Patent: Jul. 14, 2015

(54) FOLDED CASCODE AMPLIFIER

(71) Applicant: QUALCOMM Incorporated, San Diego, CA (US)

(72) Inventor: Omid Rajaee, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 63 days.

(21) Appl. No.: 13/944,683

(22) Filed: Jul. 17, 2013

(65) Prior Publication Data
US 2015/0022266 A1 Jan. 22, 2015

(51) Int. Cl.
H03F 3/45 (2006.01)
H03F 3/19 (2006.01)

(52) U.S. Cl.
CPC .............. H03F 3/45179 (2013.01); H03F 3/19 (2013.01); H03F 3/45192 (2013.01); *H03F 2203/45364* (2013.01)

(58) Field of Classification Search
CPC .......................................................... H03F 3/45
USPC .................................. 330/253, 254, 261, 311
See application file for complete search history.

(56) References Cited

U.S. PATENT DOCUMENTS 5,847,607 A * 12/1998 Lewicki et al. ............... 330/258
7,138,866 B2 11/2006 Etoh
7,164,317 B1 1/2007 Lorenz
7,295,071 B1 11/2007 Lee
7,352,241 B2 4/2008 Lee
7,701,289 B2 4/2010 Kuo et al.
2008/0246543 A1 * 10/2008 Trifonov et al. .............. 330/253
2008/0272845 A1 11/2008 Willassen et al.
2009/0066415 A1 3/2009 Kim
2009/0289703 A1 * 11/2009 Kojima et al. ..................... 330/9

FOREIGN PATENT DOCUMENTS

EP 2244381 A1 10/2010
WO 2012089810 A1 7/2012

OTHER PUBLICATIONS

Co-pending U.S. Appl. No. 13/740,013, filed Jan. 11, 2013.
International Search Report and Written Opinion—PCT/US2014/045382—ISA/EPO—Nov. 12, 2014, 11 pages.

* cited by examiner

*Primary Examiner* — Henry Choe
(74) *Attorney, Agent, or Firm* — Toler Law Group, PC

(57) ABSTRACT

Exemplary embodiments are directed to systems, devices, and methods for enhancing an amplifier. An amplifier may include a first cascode circuit including a first transistor and a second transistor. The amplifier may include a second cascode circuit coupled to a differential output and including a first pair of transistors including a first transistor and a second transistor and a second pair of transistors including a third transistor and a fourth transistor. Further, the amplifier may include a differential input including a first transistor coupled to each of the first transistor of the first cascode circuit and the first and second transistors of the second cascode circuit, the differential input further including a second transistor coupled to each of the second transistor of the first cascode circuit and the third and fourth transistors of the second cascode circuit.

20 Claims, 7 Drawing Sheets

FOLDED CASCODE AMPLIFIER

BACKGROUND

1. Field

The present invention relates generally to electronic amplifiers.

2. Background

Amplifiers are commonly used in various electronic devices to provide signal amplification. Various types of amplifiers are available and include voltage amplifiers, current amplifiers, etc. A voltage amplifier receives and amplifies an input voltage signal and provides an output voltage signal. A current amplifier receives and amplifies an input current signal and provides an output current signal. Amplifiers typically have different designs and are used in different applications. For example, a wireless communication device such as a cellular phone may include a transmitter and a receiver for bi-directional communication. The transmitter may utilize a driver amplifier (DA) and a power amplifier (PA), the receiver may utilize a low noise amplifier (LNA), and the transmitter and receiver may utilize variable gain amplifiers (VGAs).

Folded cascode amplifiers, which may include simple architectures and high bandwidths, are a desirable choice for many applications. As will be appreciated by a person having ordinary skill in the art, increasing a DC gain of a folded cascode amplifier (e.g., via gain boosting, using longer channel length for devices, triple cascoding, etc.) may require a power and/or an area penalty.

A need exists for increasing a gain of an amplifier. More specifically, a need exists for devices and methods for increasing a gain of a folded cascode amplifier without increasing the power consumption and/or the size of the amplifier.

DETAILED DESCRIPTION

Figure 1:
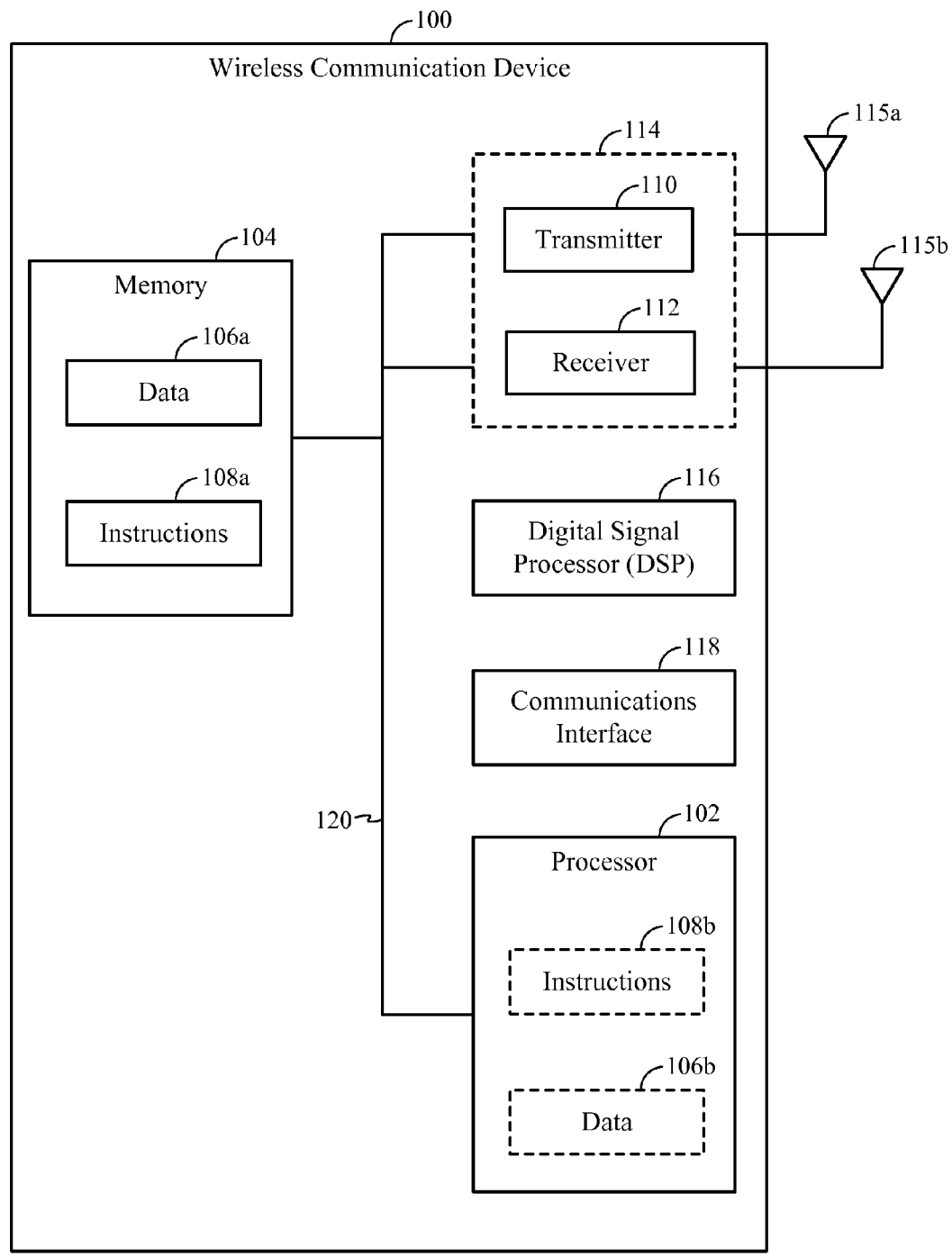
FIG. 1 illustrates a wireless communication device, according to an exemplary embodiment of the present invention.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Exemplary embodiments, as described herein, are directed to devices and methods related to folded cascode amplifiers. According to one exemplary embodiment, a device may include a first cascode circuit including a first transistor and a second transistor, wherein each transistor of the first cascode circuit is configured to receive a first bias voltage. The device may also includes second cascode circuit including a first pair of transistors including a first transistor and a second transistor and a second pair of transistors including a third transistor and a fourth transistor, wherein each transistor of the second cascode circuit is configured to receive a second bias voltage. Moreover, the device may include a differential pair of input transistors including a first transistor coupled to each of the first transistor of the first cascode circuit and the first and second transistors of the second cascode circuit. The differential pair of input transistors further includes a second transistor coupled to each of the second transistor of the first cascode circuit and the third and fourth transistors of the second cascode circuit.

According to another exemplary embodiment, the present invention includes methods for enhancing a folded cascode amplifier. Various embodiments of such a method may include receiving an input voltage at a differential pair of transistors. The method may also include biasing a first cascode circuit including a first transistor coupled to a first transistor of the differential pair and a second transistor coupled to a second transistor of the differential pair. Additionally, the method may include biasing a second cascode circuit including a first pair of transistors coupled to a first transistor of the differential pair of transistors and a second pair of transistors coupled to a second transistor of the differential pair.

Other aspects, as well as features and advantages of various aspects, of the present invention will become apparent to those of skill in the art though consideration of the ensuing description, the accompanying drawings and the appended claims.

FIG. 1 illustrates a wireless communication device 100, according to an exemplary embodiment of the present invention. Wireless communication device 100 may be an access terminal, a mobile station, a user equipment (UE), etc. Wireless communication device 100 includes a processor 102. Processor 102 may be a general purpose single or multi-chip microprocessor (e.g., an Advanced RISC Machine (ARM)), a special purpose microprocessor (e.g., a digital signal processor (DSP)), a microcontroller, a programmable gate array, etc. Processor 102 may be referred to as a central processing unit (CPU). Although just a single processor 102 is shown in wireless communication device 100 of FIG. 1, in an alternative configuration, a combination of processors (e.g., an ARM and DSP) could be used.

Wireless communication device 100 also includes memory 104. Memory 104 may be any electronic component capable of storing electronic information. Memory 104 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 106a and instructions 108a may be stored in memory 104. Instructions 108a may be executable by the processor 102 to implement the methods disclosed herein. Executing the instructions 108a may involve the use of data 106a that is stored in memory 104. When processor 102 executes instructions 108a, various portions of the instructions 108b may be loaded onto processor 102, and various pieces of the data 106b may be loaded onto processor 102.

Wireless communication device 100 may also include a transmitter 110 and a receiver 112 to allow transmission and reception of signals to and from wireless communication device 100 via a first antenna 115a and a second antenna 115b. Transmitter 110 and receiver 112 may be collectively referred to as a transceiver 114. Wireless communication device 100 may also include (not shown) multiple transmitters, additional antennas, multiple receivers and/or multiple transceivers.

Wireless communication device 100 may include a digital signal processor (DSP) 116. Wireless communication device 100 may also include a communications interface 118. Communications interface 118 may allow a user to interact with wireless communication device 100.

The various components of wireless communication device 100 may be coupled together by one or more buses, which may include a power bus, a control signal bus, a status signal bus, a data bus, etc. For the sake of clarity, the various buses are illustrated in FIG. 1 as a bus system 120.

It is noted that wireless communication device 100 may include one or more of amplifier 500 as described below with reference to FIG. 5, one or more of amplifier 600 as described below with reference to FIG. 6, or any combination thereof. It is further noted that wireless communication device 100 is an only an exemplary implementation of a wireless communication device 100 and the invention may include other wireless communication device's configurations. Further, according to one exemplary embodiment of the present invention, one or more of the amplifiers described herein may be implemented within one or more of an analog-to-digital converter (ADC), an electronic filter, and a power management circuit of a device (e.g., wireless communication device 100).

Figure 2:
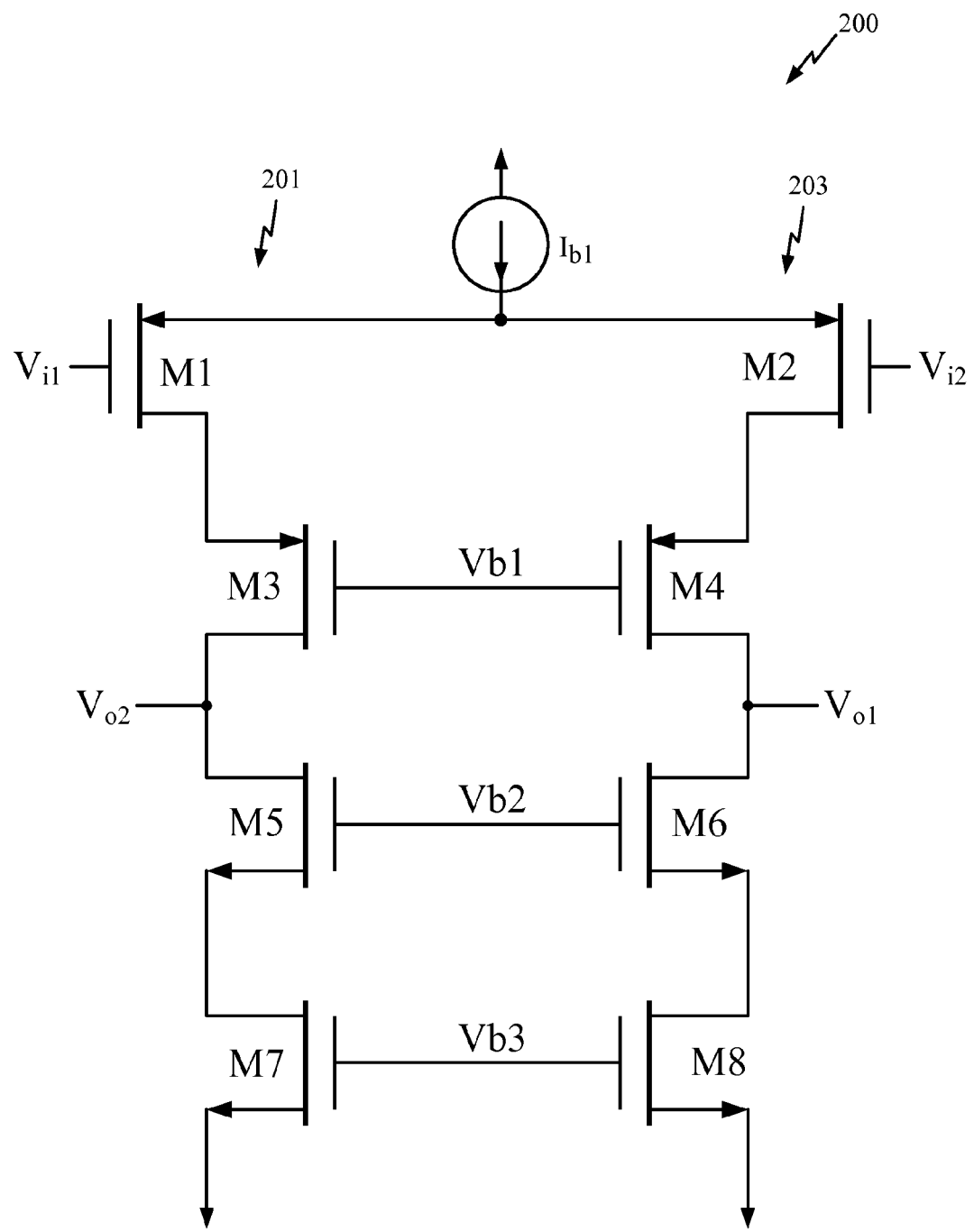
FIG. 2 illustrates a telescopic amplifier.

FIG. 2 illustrates a telescopic amplifier 200 including a current source $I_{b1}$ and a plurality of transistors M1-M8. More specifically, amplifier 100 includes a differential input including transistors M1 and M2. Transistor M1 is configured to receive an input voltage $V_{i1}$ at its gate and transistor M2 is configured to receive an input voltage $V_{i2}$ at its gate. Each of transistors M1 and M2 may be referred to as an input device. In addition, amplifier 200 includes transistors M3 and M4, each of which may be referred to as a first cascode device or an upper cascode device. Moreover, amplifier 200 includes transistors M5 and M6, each of which may be referred to as a second cascode device or a lower cascode device. Amplifier 200 includes also transistors M7 and M8, each of which may be referred to as an active load device. Transistors M7 and M8, which are respectively coupled to transistors M5 and M6, are coupled to a ground voltage GRND.

A bias voltage Vb1 may be applied to the gates of transistors M3 and M4, a bias voltage Vb2 may be applied to the gates of transistors M5 and M6, and a bias voltage Vb3 may be applied to the gates of transistors M7 and M8. An output voltage $V_{o1}$ may be coupled between a drain of transistor M4 and a drain of transistor M6, and an output voltage $V_{o2}$ may be coupled between a drain of transistor M3 and a drain of transistor M5. Accordingly, amplifier 200 includes a path 201, which includes current source $I_{bi}$ and transistors M1, M3, M5, and M7, for generating output voltage $V_{o2}$. In addition, amplifier 200 includes another path 203, which includes current source $I_{b1}$ and transistors M2, M4, M6, and M8, for generating output voltage $V_{o1}$.

As noted above, telescopic amplifiers, such as telescopic amplifier 200, include a simple architecture and high bandwidth and, thus, are used widely for moderate gain applications. However, increasing a DC gain of a telescopic amplifier (e.g., via gain boosting, increasing channel lengths, or triple cascoding) has typically required a power and/or an area penalty.

As will be appreciated by a person having ordinary skill in the art, a gain of amplifier 200 may be given by the following equation:

$$G=Gm*(Rup*Rdown/(Rup+Rdown));\qquad(1)$$

wherein G is the gain of amplifier 200, Gm is the transconductance of amplifier 200, Rup is the output impedance of the upper cascode combination (i.e., the combination of transistor M4 and transistor M2), and Rdown is the output impedance of the lower cascode combination (i.e., the combination of transistor M6 and transistor M8.

Further, Rup and Rdown of equation (1) may be defined as follows:

$$Rup=Gmx*rox*roz;\qquad(2)$$

$$Rdown=Gmy*roy*rozn;\qquad(3)$$

wherein Gmx is the transconductance of the upper cascode device (e.g., transistor M4), rox is the output impedance of the upper cascode device (e.g., transistor M4), roz is the output impedance of the input device (e.g., transistor M2), Gmy is the transconductance of the lower cascode device (e.g., transistor M6), roy is the output impedance of the lower cascode device (e.g., transistor M6), and rozn is the output of impedance of the peripheral device (e.g., transistor M8).

As will be appreciated by a person having ordinary skill in the art, to increase a gain of an amplifier, a transconductance and/or an output impedance of one or more devices (e.g., transistors) of the amplifier may be increased. However, increasing a transconductance may require additional power and increasing an output impedance may require a size increase.

Figure 3:
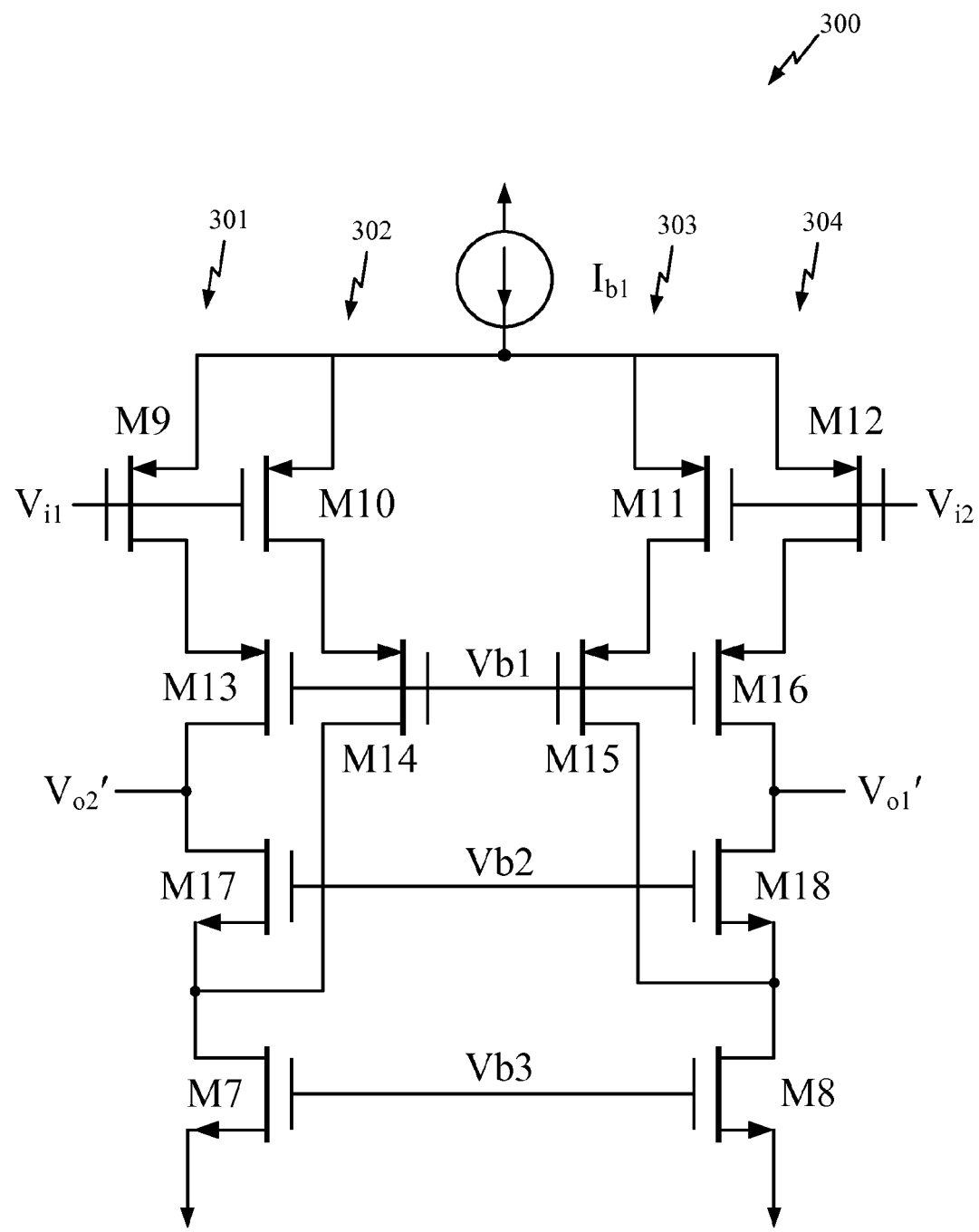
FIG. 3 illustrates a hybrid folded/telescopic amplifier.

FIG. 3 illustrates another amplifier 300. Amplifier 300 includes transistors M7-M18, current source $I_{b1}$, input voltages $V_{i1}$ and $V_{i2}$, and output voltages $V_{o1'}$ and $V_{o2'}$. More specifically, amplifier 300 includes a differential input including transistors M9-M12. As illustrated, a gate of each of transistor M9 and transistor M10 is configured to receive input voltage $V_{i1}$, and a gate of each of transistor M11 and transistor M12 is configured to receive input voltage $V_{i2}$. Further, a source of each of transistors M9-M12 is coupled to current source $I_{b1}$. According to one exemplary embodiment of the present invention, a size of each of transistors M9-M12 is a fraction of a size of each of transistors M1 and M2 (see FIG. 2). As a more specific example, a size of each of transistors M9-M12 is a one-half the size of each of transistors M1 and M2.

Further, amplifier 300 includes first cascode circuit including transistors M13-M16 and second cascode circuit including transistors M17 and M18. Each of transistors M13-M16 may be referred to as a first cascode device or an upper cascode device and each of transistors M17 and M18 may be referred to as a second cascode device or a lower cascode device.

Amplifier 300 also includes transistors M7 and M8, each of which, as noted above, may be referred to as an active load device. A drain of transistor M9 is coupled to a source of transistor M13, and a drain of transistor M10 is coupled to a source of transistor M14. Moreover, a drain of transistor M12 is coupled to a source of transistor M16, and a drain of transistor M11 is coupled to a source of transistor M15. A gate of each of transistors M13-M16 is configured to receive a bias voltage Vb1, a gate of each of transistors M17 and M18 is configured to receive a bias voltage Vb2 and a gate of each of transistors M7 and M8 is configured to receive a bias voltage Vb3. In addition, a drain of transistor M13 is coupled to a drain of transistor M17, and a drain of transistor M14 is coupled to a source of transistor M17. Furthermore, a drain of transistor M16 is coupled to a drain of transistor M18, and a drain of transistor M15 is coupled to a source of transistor M18. Additionally, a source of transistor M17 is coupled to a drain of transistor M7, which includes a source coupled to a ground voltage GRND. Also, a source of transistor M18 is coupled to a drain of transistor M8, which includes a source coupled to ground voltage GRND. Output voltage $V_{o1'}$ is coupled between a drain of transistor M16 and a drain of transistor M18, and output voltage $V_{o2'}$ is coupled between a drain of transistor M13 and a drain of transistor M17.

Accordingly, amplifier 300 includes a path 301, which includes current source $I_{b1}$ and transistors M9, M13, M17, and M7 and a path 302, which includes current source $I_{b1}$ and transistors M10, M14, M17, and M7. Moreover, amplifier 300 includes a path 303, which includes current source $I_{b1}$ and transistors M11, M15, M18, and M8, and a path 304, which includes current source $I_{b1}$ and transistors M12, M16, M18, and M8. Paths 301 and 302 are configured to generate output voltage $V_{o2'}$ and paths 303 and 304 are configured to generate output voltage $V_{o1'}$.

According to one exemplary embodiment of the present invention, a size of each of transistors M13-M16 is a fraction of a size of each of transistors M3 and M4 (see FIG. 2), and a size of each of transistors M17 and M18 is a fraction of a size of each of transistors M5 and M6 (see FIG. 2). As a more specific example, a size of each of transistors M13-M16 is a one-half the size of each of transistors M3 and M4, and a size of each of transistors M17 and M18 is a one-half the size of each of transistors M5 and M6.

As will be understood by a person having ordinary skill in the art, in comparison to each path of amplifier 200 (i.e., paths 201 and 203) illustrated in FIG. 2, an amount of current in each path of amplifier 300 (i.e., paths 301-304) may be reduced by a factor of two, an output impedance of each upper cascode device may be increased by a factor of two, an output impedance of each lower cascode device may be increased by a factor of two, an output impedance of each input device may be increased by a factor of two, a transconductance of each lower cascode device may reduced by a factor of two, and a transconductance of each upper cascode device may reduced by a factor of two. Thus R'up, which is the output impedance of the upper cascode combination (e.g., transistors M12 and M16), and R'down, which is the output impedance of the lower cascode combination (e.g., transistor M18 and M8), may be defined as follows:

$$R'up = (Gmx'/2)*(2rox')*(2roz'); \quad (4)$$

$$R'down = (Gmy'/2)*(2roy')*rozn'; \quad (5)$$

wherein Gmx' is the transconductance of the upper cascode devices (e.g., transistors M15 and M16), rox' is the output impedance of the upper cascode devices (e.g., transistors M15 and M16), roz' is the output impedance of the input devices (e.g., transistor M11 and M12), Gmy' is the transconductance of the lower cascode device (e.g., transistor M18), roy' is the output impedance of the lower cascode device (e.g., transistor M18), and rozn' is the output of impedance of the active load device (e.g., transistor M8).

Accordingly, in comparison to Rup of amplifier 200, R'up of amplifier 300 is increased by a factor of two, and R'down of amplifier 300 is substantially the same as Rdown of amplifier 200. Further, a gain G' of amplifier 200 may be defined as follows:

$$G' = (Gm'/2 + Gm'/2)*(R'up*R'down/(R'up+R'down)); \quad (6)$$

wherein G' is the gain of amplifier 300 and Gm' is the transconductance of amplifier 300.

Therefore, as will be appreciated by a person having ordinary skill in the art, in comparison to amplifier 200 (FIG. 2), the gain of amplifier 300 is increased.

Figure 4:
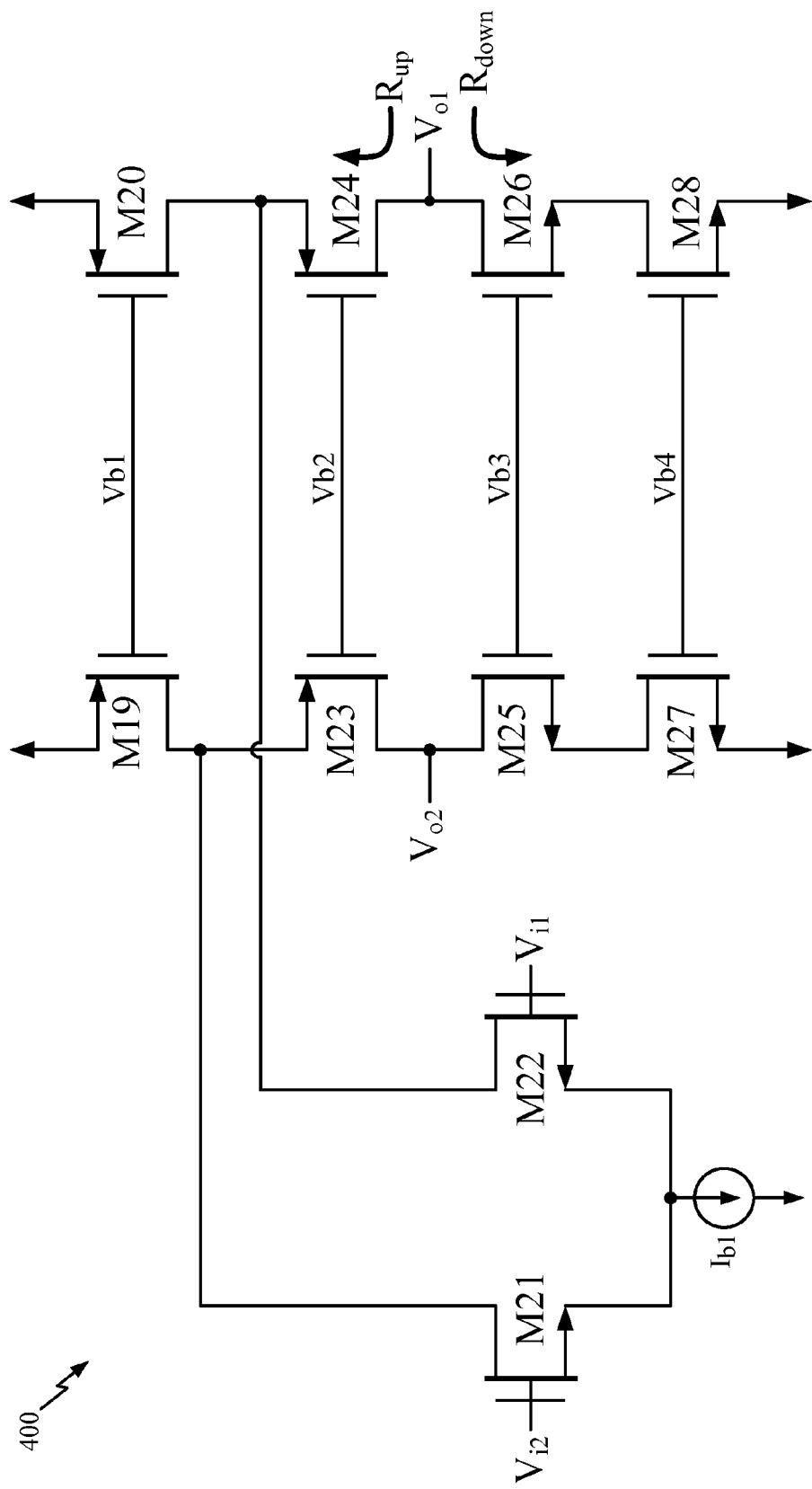
FIG. 4 is depicts a folded cascode amplifier.

FIG. 4 illustrates a folded cascode amplifier 400 including current source $I_{b1}$ and a plurality of transistors M19-M27. More specifically, amplifier 400 includes a differential input including transistors M21 and M22. Transistor M22 is configured to receive input voltage $V_{i1}$ at its gate and transistor M21 is configured to receive input voltage $V_{i2}$ at its gate. A source of each of transistor M21 and M22 is coupled to current source $I_{b1}$. Each of transistors M21 and M22 may be referred to as an input device. In addition, amplifier 400 includes transistors M19 and M20, each of which may be referred to as a cascode device or, more specifically, an upper cascode device. As illustrated, a source of transistor M19 and a source of transistor M20 are coupled to a ground voltage. A gate of each of transistor M19 and transistor M20 is configured to receive bias voltage Vb1. Further, a drain of transistor M21 is coupled to a drain of transistor M19 and a drain of transistor M22 is coupled to a drain a transistor M20.

Moreover, amplifier 400 includes transistors M23 and M24, each of which may be referred to as a cascode device or, more specifically, a middle cascode device. A source of transistor M23 is coupled to a drain of transistor M19 and a drain of transistor M21. Further, a source of transistor M24 is coupled to a drain of transistor M20 and a drain of transistor M22. A gate of transistor M23 and a gate of transistor M24 are configured to receive bias voltage Vb2. In addition, amplifier 400 includes transistor M25 and transistor M26. A drain of transistor M25 is coupled to a drain of transistor M23, and a drain of transistor M26 is coupled to a drain of transistor M24. Each of transistors M25 and M26 are configured to receive bias voltage Vb3 at a respective gate. Each of transistors M25 and M26 may be referred to as a cascode device or, more specifically, a lower cascode device.

Amplifier 400 also includes transistors M27 and M28, each of which may be referred to as an active load device or a peripheral device. A drain of transistor M27 is coupled to a source of transistor M25, a source of transistor M27 is coupled to a ground voltage, and a gate of transistor M27 is configured to receive bias voltage Vb4. Moreover, a drain of transistor M28 is coupled to a source of transistor M26, a source of transistor M28 is coupled to a ground voltage, and a gate of transistor M28 is configured to receive bias voltage Vb4.

An output voltage $V_{o2''}$ of amplifier 400 may be conveyed between a drain of transistor M23 and a drain of transistor M25, and an output voltage $V_{o1''}$ may be coupled between a drain of transistor M24 and a drain of transistor M26. Accordingly, amplifier 400 includes a single current path, which includes current source $I_{b1}$ and transistors M19, M21, M23, M25, and M27, for generating output voltage $V_{o2''}$. In addition, amplifier 400 includes a single current path, which includes current source $I_{b1}$ and transistors M20, M22, M24, M26, and M28, for generating output voltage $V_{o1''}$.

As will be appreciated by a person having ordinary skill in the art, a gain of amplifier 400 may be given by the following equation:

$$G'' = Gm''*(R''up*R''down/(R''up+R''down)); \quad (7)$$

wherein G″ is the gain of amplifier 400, Gm″ is the transconductance of amplifier 400, R″up is the output impedance of a cascode combination (i.e., the combination of transistors M24, M20, and M22), and R″down is the output impedance of another cascode combination (i.e., the combination of transistors M26 and M28).

Further, R″up and R″down of equation (7) may be defined as follows:

$$R''up = Gmx'' * rox'' * (roz'' * rov''/(roz'' + rov'')); \quad (8)$$

$$R''down = Gmy'' * roy'' * row''; \quad (9)$$

wherein Gmx″ is the transconductance of the middle cascode device (e.g., transistor M24), rox″ is the output impedance of the middle cascode device (e.g., transistor M24), roz″ is the output impedance of the upper cascode device (e.g., transistor M20), rov″ is the output impedance of the input device (e.g., transistor M22). Gmy″ is the transconductance of the lower cascode device (e.g., transistor M26), roy″ is the output impedance of the lower cascode device (e.g., transistor M26), and row″ is the output impedance of the peripheral device (e.g., transistor M28).

As will be appreciated by a person having ordinary skill in the art, to increase a gain of an amplifier, a transconductance and/or an output impedance of one or more devices (e.g., transistors) of the amplifier may be increased. However, increasing a transconductance may require additional power and increasing an output impedance may require a size increase.

Figure 5:
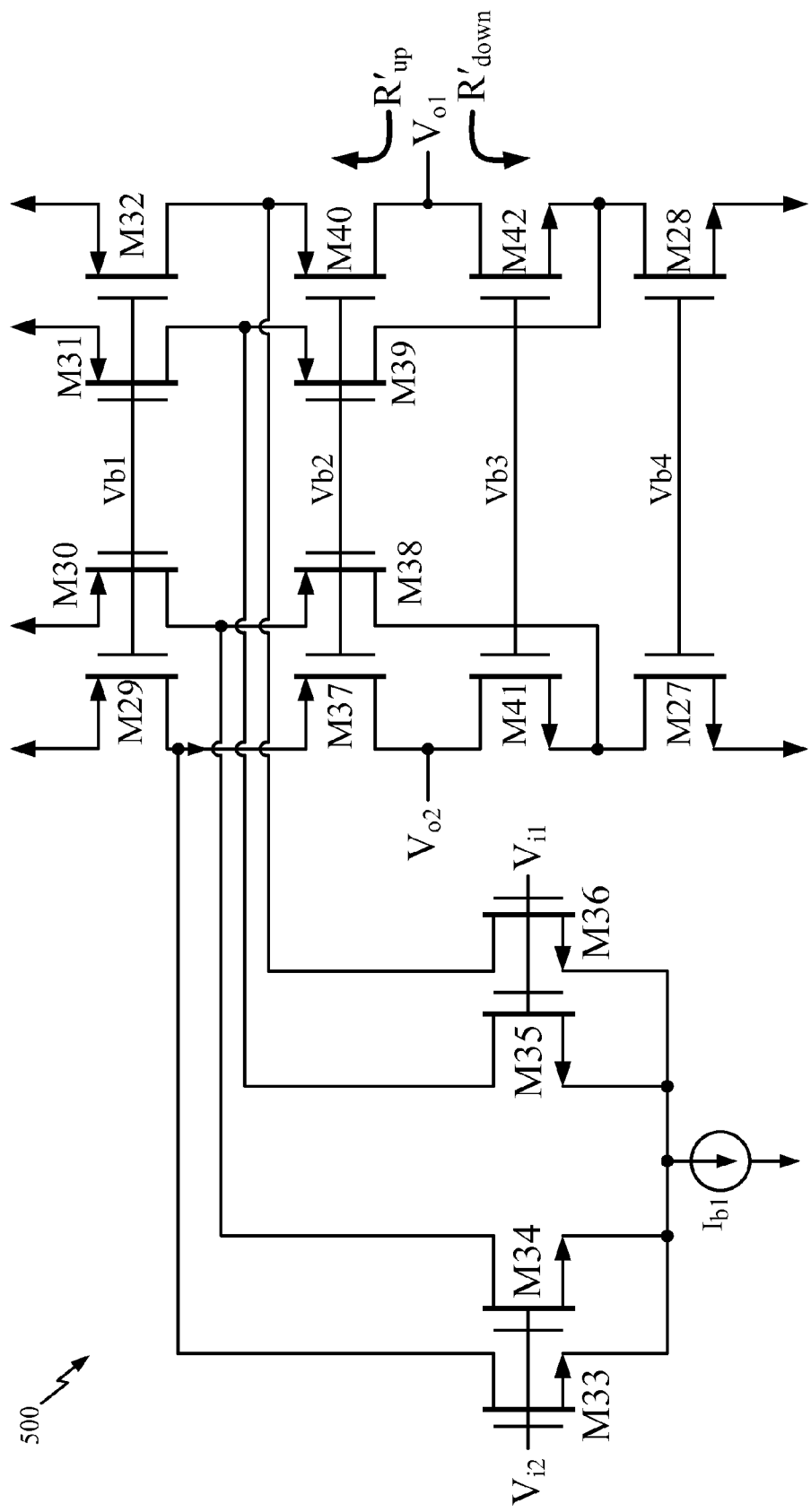
FIG. 5 is depicts another folded cascode amplifier, in accordance with an exemplary embodiment of the present invention.

FIG. 5 illustrates another folded cascode amplifier 500, according to an exemplary embodiment of the present invention. Amplifier 500 includes transistors M27-M42, current source $I_{b1}$, input voltages $V_{i1}$ and $V_{i2}$, and output voltages $V_{o1}'''$ and $V_{o2}'''$. More specifically, amplifier 500 includes a differential input including transistors M33-M36. As illustrated, a gate of each of transistor M33 and transistor M34 is configured to receive input voltage $V_{i2}$, and a gate of each of transistor M35 and transistor M36 is configured to receive input voltage $V_{i1}$. Further, a source of each of transistors M33-M36 is coupled to current source $I_{b1}$.

According to one exemplary embodiment of the present invention, a size of each of transistors M33-M36 is a fraction of a size of each of transistors M21 and M22 (see FIG. 4). As a more specific example, a size of each of transistors M33-M36 is a one-half the size of each of transistors M21 and M22.

Further, amplifier 500 includes transistors M29-M32 and transistors M37-M40. Each of transistors M29-M32 may be referred to as a cascode device or, more specifically, an upper cascode device, and each of transistors M37-M40 may be referred to as a cascode device or, more specifically, a middle cascode device. A drain of transistor M29 is coupled to a source of transistor M37, a drain of transistor M30 is coupled to a source of transistor M38, a drain of transistor M31 is coupled to a source of transistor M39, and a drain of transistor M32 is coupled to a source of transistor M40. A source of each of transistors M29-M23 is coupled to a ground voltage and a gate of each of transistors M29-M32 is configured to receive bias voltage Vb1. Further, a gate of each of transistors M37-M40 is configured to receive bias voltage Vb2.

Moreover, a drain of transistor M33 is coupled to a drain of transistor M29 and a source of transistor M37. A drain of transistor M34 is coupled to a drain of transistor M30 and a source of transistor M38. A drain of transistor M35 is coupled to a drain of transistor M31 and a source of transistor M39. Further, a drain of transistor M36 is coupled to a drain of transistor M32 and a source of transistor M40.

Amplifier 500 further includes transistors M41 and M42. A source of transistor M41 is coupled to a drain of transistor M38, and a drain of transistor M41 is coupled to a drain of transistor M37. A gate of transistor M41 is configured to receive bias voltage Vb3. Additionally, a source of transistor M42 is coupled to a drain of transistor M39, a drain of transistor M41 is coupled to a drain of transistor M40, and gate of transistor M41 is configured to receive bias voltage Vb3. Each of transistors M41 and M42 may be referred to as a cascode device or, more specifically, a lower cascode device.

Amplifier 500 also includes transistors M27 and M28, each of which, as noted above, may be referred to as an active load device. A drain of transistor M27 is coupled to a source of transistor M41 and a drain of transistor M38, and a source of transistor M27 is coupled to the ground voltage. Moreover, a drain of transistor M28 is coupled to a source of transistor M42 and a drain of transistor M39, and a source of transistor M28 is coupled to the ground voltage. Output voltage $V_{o2}'''$ is coupled between the drain of transistor M37 and the drain of transistor M41, and output voltage $V_{o1}'''$ is coupled between the drain of transistor M40 and a drain of transistor M42.

Accordingly, amplifier 500 includes a first plurality of current paths for generating output voltage $V_{o2}'''$ and a second plurality of current paths for generating output voltage $V_{o1}'''$. More specifically, output voltage $V_{o2}'''$ may be generated via a first current path including current source $I_{b1}$ and transistors M33, M29, M37, M41 and M27 and a second current path including current source $I_{b1}$ and transistors M34, M30, M38, M41 and M27. Further, output voltage $V_{o1}'''$ may be generated via a third current path including current source $I_{b1}$ and transistors M35, M31, M39, M42 and M28 and a fourth current path including current source $I_{b1}$ and transistors M36, M32, M40, M42 and M28.

According to one exemplary embodiment of the present invention, a size of each of transistors M29-M32 is a fraction of a size of each of transistors M19 and M20 (see FIG. 4), a size of each of transistors M37-M40 is a fraction of a size of each of transistors M23 and M24 (see FIG. 4), and a size of each of transistors M41 and M42 is a fraction of a size of each of transistors M25 and M26 (see FIG. 4). As a more specific example, a size of each of transistors M29-M32 is one-half the size of each of transistors M19 and M20, a size of each of transistors M37-M40 is a one-half the size of each of transistors M23 and M24, and a size of each of transistors M41 and M42 is one-half the size of each of transistors M25 and M26 (see FIG. 4).

As will be understood by a person having ordinary skill in the art, in comparison to amplifier 400 illustrated in FIG. 4, which only includes a single current path for generating output voltage output voltage $V_{o2}''$ and a single current path for generating output voltage $V_{o1}''$, an amount of current in each current path of amplifier 500 may reduced by a factor of two, an output impedance of each upper cascode device may be increased by a factor of two, an output impedance of each middle cascode device may be increased by a factor of two, an output impedance of each lower cascode device may be increased by a factor of two, an output impedance of each input device may be increased by a factor of two, a transconductance of each lower cascode device may be reduced by a factor of two, and a transconductance of each middle cascode device may be reduced by a factor of two, and a transconductance of each upper cascode device may be reduced by a factor of two. Thus R‴up, which is the output impedance of a cascode combination (e.g., transistors M40, M32, and M36), and R‴down, which is the output impedance of another cascode combination (e.g., transistor M42 and M28), may be defined as follows:

$$R'''\text{up}=2(Gmx'''rox'''(roz'''*rov'''/(roz'''+rov''')));  \quad (10)$$

$$R'''\text{down}=(Gmy'''/2)*(2roy''')*row'''=Gmy'''roy'''row'''; \quad (11)$$

wherein Gmx''' is the transconductance of the middle cascode devices (e.g., transistors M39 and M40), rox''' is the output impedance of the middle cascode devices (e.g., transistors M39 and M40), roz''' is the output impedance of the upper cascode devices (e.g., transistors M31 and M32), rov''' is the output impedance of the input devices (e.g., transistors M35 and M36), Gmy''' is the transconductance of the lower cascode device (e.g., transistor M42), roy''' is the output impedance of the lower cascode device (e.g., transistor M42), and row''' is the output of impedance of the active load device (e.g., transistor M28).

Accordingly, in comparison to R"up of amplifier 400, R'''up of amplifier 500 is increased by a factor of two, and R'''down of amplifier 500 is substantially the same as R"down of amplifier 400. Further, a gain G''' of amplifier 500 may be defined as follows:

$$G'''=(Gm'''/2+Gm'''/2)*(R'''\text{up}*R'''\text{down}/(R'''\text{up}+R'''\text{down})); \quad (12)$$

wherein G''' is the gain of amplifier 500 and Gm''' is the transconductance of amplifier 500. Therefore, in comparison to amplifier 400 (FIG. 4), the gain of amplifier 500 is increased.

Figure 6:
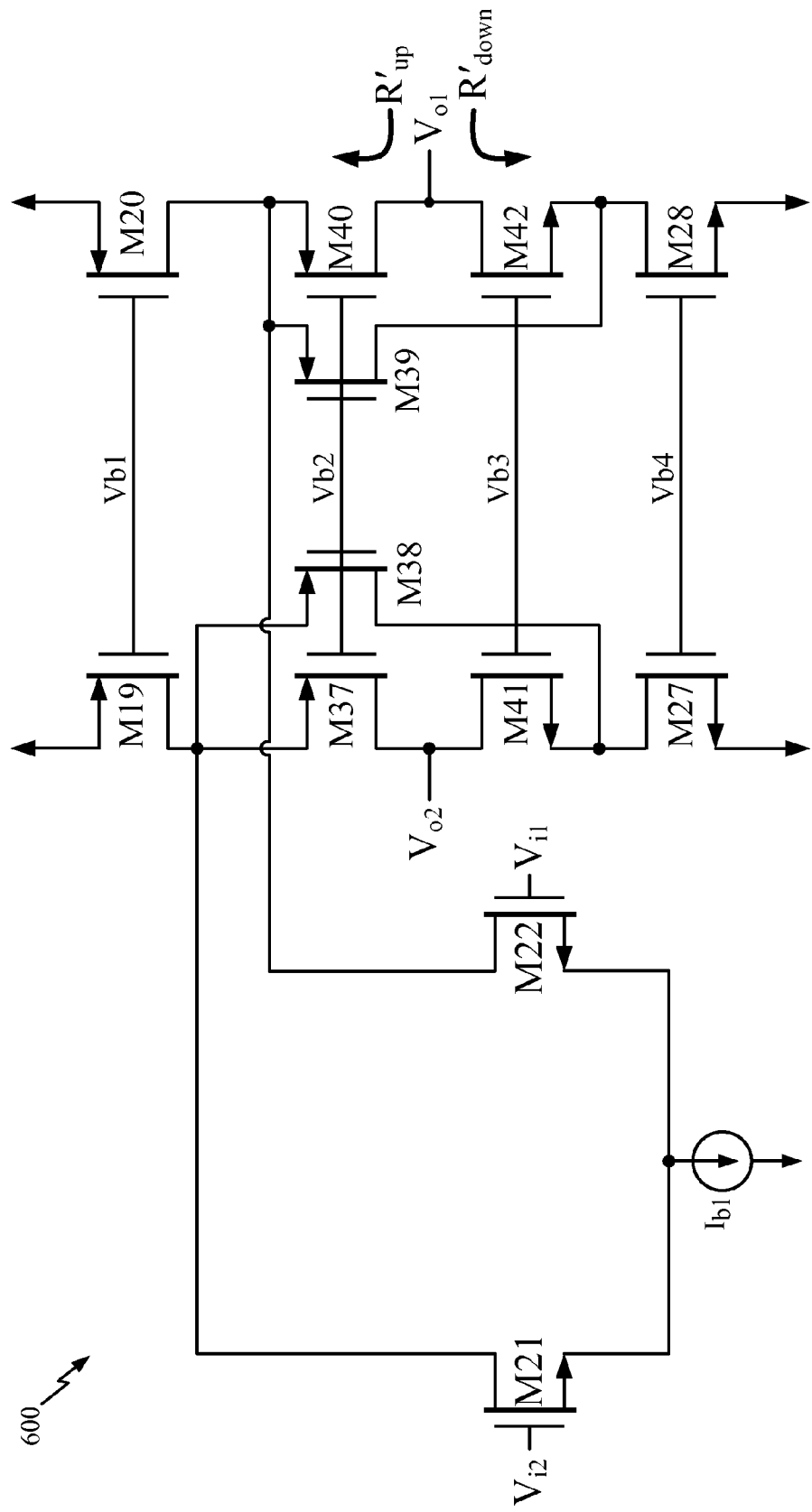
FIG. 6 illustrates yet another folded cascode amplifier, in accordance with an exemplary embodiment of the present invention.

FIG. 6 depicts another amplifier 600, in accordance with an exemplary embodiment of the present invention. Amplifier 600 includes transistors M19-M22, M27, M28, and M37-42, current source $I_{b1}$, input voltages $V_{i1}$ and $V_{i2}$, and output voltages $V_{o1''''}$ and $V_{o2''''}$. More specifically, amplifier 600 includes a differential input including transistors M21 and M22. As illustrated, a gate of transistor M21 is configured to receive input voltage $V_{i2}$, and a gate of transistor M22 is configured to receive input voltage $V_{i1}$. Further, a source of each of transistors M21 and M22 is coupled to current source $I_{b1}$.

Further, amplifier 600 includes transistors M19 and M20 and transistors M37-M40. Each of transistors M19 and M20 may be referred to as a cascode device or, more specifically, an upper cascode device, and each of transistors M37-M40 may be referred to as a cascode device or, more specifically, a middle cascode device. A drain of transistor M21 is coupled to a drain of transistor M19, which is further coupled to a source of transistor M37 and a source of transistor M38. Further, a drain of transistor M22 is coupled to a drain of transistor M20, which is further coupled to a source of transistor M39 and a source of transistor M40. A source of each of transistors M19 and M20 is coupled to a ground voltage and a gate of each of transistors M19 and M20 is configured to receive bias voltage Vb1. Further, a gate of each of transistors M37-M40 is configured to receive bias voltage Vb2.

In addition, a source of transistor M41 is coupled to a drain of transistor M38 and a drain of transistor M41 is coupled to a drain of transistor M37. A gate of transistor M41 is configured to receive bias voltage Vb3. Additionally, a source of transistor M42 is coupled to a drain of transistor M39, a drain of transistor M42 is coupled to a drain of transistor M40, and gate of transistor M42 is configured to receive bias voltage Vb3.

Furthermore, a drain of transistor M27 is coupled to a source of transistor M41 and a drain of transistor M38, and a source of transistor M27 is coupled to the ground voltage. Moreover, a drain of transistor M28 is coupled to a source of transistor M42 and a drain of transistor M39, and a source of transistor M28 is coupled to the ground voltage. Output voltage $V_{o2''''}$ is coupled between the drain of transistor M37 and the drain of transistor M41, and output voltage $V_{o1''''}$ is coupled between the drain of transistor M40 and a drain of transistor M42.

Accordingly, amplifier 600 includes a first plurality of current paths for generating output voltage $V_{o2''''}$ and a second plurality of current paths for generating output voltage $V_{o1''''}$. More specifically, output voltage $V_{o2''''}$ may be generated via a first current path including current source $I_{b1}$ and transistors M21, M19, M37, M41 and M27 and a second current path including current source $I_{b1}$ and transistors M21, M19, M38, M41 and M27. Further, output voltage $V_{o1''''}$ may be generated via a third current path including current source $I_{b1}$ and transistors M22, M20, M40, M42 and M28 and a fourth current path including current source $I_{b1}$ and transistors M22, M20, M39, M42 and M28.

As noted above, a size of each of transistors M37-M40 is a fraction of a size of each of transistors M23 and M24 (see FIG. 4). Further, a size of each of transistors M41 and M42 is a fraction of a size of each of transistors M25 and M26 (see FIG. 4). As a more specific example, a size of each of transistors M37-M40 is one-half the size of each of transistors M23 and M24, and a size of each of transistors M41 and M42 is one-half the size of each of transistors M25 and M26 (see FIG. 4).

As will be understood by a person having ordinary skill in the art, in comparison to amplifier 400 illustrated in FIG. 4, which only includes a single current path for generating output voltage output voltage $V_{o2''''}$ and a single current path for generating output voltage $V_{o1''''}$, an amount of current in each path of amplifier 600 may reduced by a factor of two, an output impedance of each upper cascode device may be increased by a factor of two, an output impedance of each middle cascode device may be increased by a factor of two, an output impedance of each lower cascode device may be increased by a factor of two, an output impedance of each input device may be increased by a factor of two, a transconductance of each lower cascode device may reduced by a factor of two, a transconductance of each middle cascode device may reduced by a factor of two and a transconductance of each upper cascode device may reduced by a factor of two. Thus R""up, which is the output impedance of a cascode combination (e.g., transistors M40, M22, and M20), and R""down, which is the output impedance of another cascode combination (e.g., transistor M42 and M28), may be defined as follows:

$$R''''\text{up}=2(Gmx''''rox''''(roz''''*rov''''/(roz''''+rov'''')));  \quad (13)$$

$$R''''\text{down}=(Gmy''''/2)*(2roy'''')*row''''=Gmy''''roy''''row''''; \quad (14)$$

wherein Gmx'''' is the transconductance of the middle cascode devices (e.g., transistors M39 and M40), rox'''' is the output impedance of the middle cascode devices (e.g., transistors M39 and M40), roz'''' is the output impedance of the upper cascode device (e.g., transistor M20), rov'''' is the output impedance of the input device (e.g., transistor M22), Gmy'''' is the transconductance of the lower cascode device (e.g., transistor M42), roy'''' is the output impedance of the lower cascode device (e.g., transistor M42), and row'''' is the output of impedance of the active load device (e.g., transistor M28).

Accordingly, in comparison to R"up of amplifier 400, R""up of amplifier 600 is increased by a factor of two, and R""down of amplifier 600 is substantially the same as R"down of amplifier 400. Further, a gain G"" of amplifier 600 may be defined as follows:

$$G''''=(Gm''''/2+Gm''''/2)*(R''''\text{up}*R''''\text{down}/(R''''\text{up}+R''''\text{down})); \quad (15)$$

wherein G"" is the gain of amplifier 600 and Gm"" is the transconductance of amplifier 600. Therefore, in comparison amplifier 400 (FIG. 4), the gain of amplifier 600 is increased.

Figure 7:
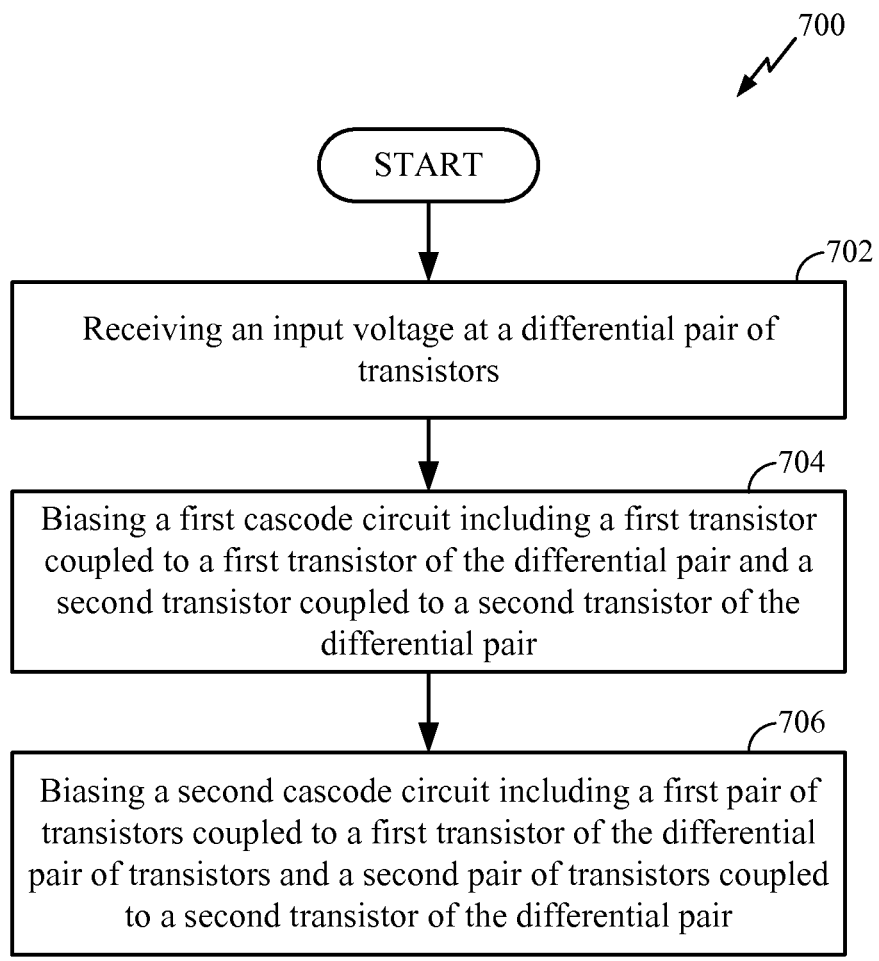
FIG. 7 is a flowchart illustrating a method, according to an exemplary embodiment of the present invention.

FIG. 7 is a flowchart illustrating a method 700, in accordance with one or more exemplary embodiments. Method 700 may include receiving an input voltage at a differential pair of transistors (depicted by numeral 702). Method 700 may also include biasing a first cascode circuit including a first transistor coupled to a first transistor of the differential pair and a second transistor coupled to a second transistor of the differential pair (depicted by numeral 704). Further, method 700 may include biasing a second cascode circuit including a first pair of transistors coupled to a first transistor of the differential pair of transistors and a second pair of transistors coupled to a second transistor of the differential pair (depicted by numeral 706).

As described herein, the present invention may increase a DC gain of a folded cascode amplifier significantly (e.g., by 4 dB) with no power or area penalty. Further, if a bandwidth of the amplifier is limited by the parasitic capacitance of cascode devices, the present invention may increase the amplifier bandwidth as well, since the amplifier may have smaller cascode devices. In addition, it is noted that although an amplifier, according to one or more exemplary embodiments of the present invention, may have a reduced phase margin (PM), the PM for a single-stage folded cascode amplifier is usually relatively high and, therefore, a few degrees of PM reduction may not degrade stability. It is further noted that the amplifiers described above with reference to FIGS. 5 and 6 may include slew-rates that are substantially the same as slew-rates of conventional folded cascode amplifiers. In addition, the present invention may be used to maintain the DC gain while reducing the length of cascode devices. Accordingly, significant bandwidth improvement may be provided with little or no increase in power consumption.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device, comprising:
   a first cascode circuit including a first transistor and a second transistor;
   a second cascode circuit coupled to a differential output and including a first pair of transistors including a first transistor and a second transistor and a second pair of transistors including a third transistor and a fourth transistor, the second transistor of the first pair of transistors having a drain connected to a source of the first transistor of the first cascode circuit, the fourth transistor of the second pair of transistors having a drain connected to a source of the second transistor of the first cascode circuit; and
   a differential input circuit including a first transistor coupled to each of the first transistor of the first cascode circuit and the first and second transistors of the second cascode circuit, the differential input circuit further including a second transistor coupled to each of the second transistor of the first cascode circuit and the third and fourth transistors of the second cascode circuit.

2. The device of claim 1, wherein the first transistor of the differential input circuit is configured to receive a first input voltage and the second transistor of the differential input circuit is configured to receive a second input voltage.

3. The device of claim 1, wherein the differential input circuit includes a first pair of transistors configured to receive a first input voltage and a second pair of transistors configured to receive a second input voltage.

4. The device of claim 1, further comprising an upper cascode circuit, a first transistor of the upper cascode circuit coupled to a drain of the first transistor of the differential input circuit transistors and to a source of each of the first and second transistors of the second cascode circuit.

5. The device of claim 1, further comprising a third cascode circuit including a first transistor coupled to the first pair of transistors of the second cascode circuit and a second transistor coupled to the second pair of transistors of the second cascode circuit, a first transistor of the third cascode circuit and a second transistor of the third cascode circuit configured to receive a bias voltage.

6. The device of claim 1, wherein the differential input circuit includes a first pair of transistors including the first transistor and a third transistor and a second pair of transistors including the second transistor and a fourth transistor.

7. The device of claim 6, the first transistor of the first pair of transistors of the differential input circuit coupled to the first transistor of the first pair of transistors of the second cascode circuit and the third transistor of the first pair of transistors of the differential input circuit coupled to the second transistor of the first pair of transistors of the second cascode circuit.

8. The device of claim 6, the second transistor of the second pair of transistors of the differential input circuit coupled to the third transistor of the second pair of transistors of the second cascode circuit and the fourth transistor of the second pair of transistors of the differential input circuit coupled to the fourth transistor of the second pair of transistors of the second cascode circuit.

9. The device of claim 6, further comprising an upper cascode circuit that includes a first pair of transistors including a first transistor and a third transistor and a second pair of transistors including a second transistor and a fourth transistor.

10. The device of claim 9, the first transistor of the first pair of transistors of the upper cascode circuit is coupled to the first transistor of the first pair of transistors of the second cascode circuit and the third transistor of the first pair of transistors of the upper cascode circuit is coupled to the second transistor of the first pair of transistors of the second cascode circuit.

11. The device of claim 9, the second transistor of the second pair of transistors of the upper cascode circuit is coupled to the third transistor of the second pair of transistors of the second cascode circuit and the fourth transistor of the second pair of transistors of the upper cascode circuit is coupled to the fourth transistor of the second pair of transistors of the second cascode circuit.

12. The device of claim 1, wherein the first transistor of the first cascode circuit, the first transistor of the differential input circuit, and the first pair of transistors of the second cascode circuit form a first plurality of current paths to generate a first output and the second transistor of the first cascode circuit, the second transistor of the differential input circuit, and the second pair of transistors of the second cascode circuit form a second path of a second plurality of currents paths to generate a second output.

13. A method, comprising:
biasing a first cascode circuit including a first transistor and a second transistor;
biasing a second cascode circuit coupled to a differential output and including a first pair of transistors including a first transistor and a second transistor and a second pair of transistors including a third transistor and a fourth transistor, the second transistor of the first pair of transistors having a drain connected to a source of the first transistor of the first cascode circuit, the fourth transistor of the second pair of the transistors having a drain connected to a source of the second transistor of the first cascode circuit; and
receiving an input voltage at a differential input circuit including a first transistor coupled to each of the first transistor of the first cascode circuit and the first and second transistors of the second cascode circuit, the differential input circuit further including a second transistor coupled to each of the second transistor of the first cascode circuit and the third and fourth transistors of the second cascode circuit.

14. The method of claim 13, further comprising:
generating a first differential output voltage at a drain of a first transistor of the first pair of transistors of the second cascode circuit; and
generating a second differential output voltage at a drain of a first transistor of the second pair of transistors of the second cascode circuit.

15. The method of claim 13, further comprising conveying an amplified output voltage at an output coupled to the second cascode circuit.

16. A device, comprising:
means for biasing a first cascode circuit including a first transistor and a second transistor;
means for biasing a second cascode circuit coupled to a differential output and including a first pair of transistors including a first transistor and a second transistor and a second pair of transistors including a third transistor and a fourth transistor, the second transistor of the first pair of transistors having a drain connected to a source of the first transistor of the first cascode circuit, the fourth transistor of the second pair of transistors having a drain connected to a source of the second transistor of the first cascode circuit; and
means for receiving an input voltage at a differential input circuit including a first transistor coupled to each of the first transistor of the first cascode circuit and the first and second transistors of the second cascode circuit, the differential input circuit further including a second transistor coupled to each of the second transistor of the first cascode circuit and the third and fourth transistors of the second cascode circuit.

17. The device of claim 16, further comprising:
means for generating a first differential output voltage at a drain of a first transistor of the first pair of transistors of the second cascode circuit; and
means for generating a second differential output voltage at a drain of a first transistor of the second pair of transistors of the second cascode circuit.

18. The device of claim 16, further comprising means for conveying a differential output voltage via a differential output coupled to the second cascode circuit.

19. The device of claim 16, further comprising means for generating a plurality of currents for generating a first differential output voltage and a second plurality of currents for generating a second output voltage.

20. The device of claim 16, further comprising means for biasing a third cascode circuit including a first transistor coupled to the first pair of transistors of the second cascode circuit and a second transistor coupled to the second pair of transistors of the second cascode circuit.

\* \* \* \* \*

UNITED STATES PATENT AND TRADEMARK OFFICE
CERTIFICATE OF CORRECTION

PATENT NO.         : 9,083,296 B2                                   Page 1 of 1
APPLICATION NO.    : 13/944683
DATED              : July 14, 2015
INVENTOR(S)        : Omid Rajaee It is certified that error appears in the above-identified patent and that said Letters Patent is hereby corrected as shown below:

In the Claims
Column 13, Claim 4, Lines 14 and 15, "the differential input circuit transistors" should read --the differential input circuit--.
Column 13, Claim 5, Line 21, "a first transistor" should read --the first transistor--.
Column 13, Claim 5, Line 22, "a second transistor" should read --the second transistor--.
Column 13, Claim 10, Line 47, "the first transistor" should read --wherein the first transistor--.
Column 13, Claim 11, Line 54, "the second transistor" should read --wherein the second transistor--.
Column 14, Claim 12, Line 2, "a second path of a second plurality of current paths" should read --a second plurality of current paths--.
Column 14, Claim 13, Line 14, "the second pair of the transistors" should read --the second pair of transistors--.
Column 14, Claim 14, Lines 26 and 27, "a drain of a first transistor" should read --a drain of the first transistor--.
Column 14, Claim 14, Line 30, "a first transistor" should read --the fourth transistor--.
Column 14, Claim 15, Lines 33 and 34, "an amplified output voltage at an output coupled to the second cascode circuit" should read --the differential output--.
Column 14, Claim 17, Line 58, "drain of a first transistor" should read --drain of the first transistor--.
Column 14, Claim 17, Line 61, "a first transistor" should read --the fourth transistor--.
Column 14, Claim 18, Lines 64 and 65, "a differential output coupled to the second cascode circuit" should read --the differential output--.

Signed and Sealed this
Twenty-fourth Day of November, 2015

Michelle K. Lee
*Director of the United States Patent and Trademark Office*